(12) United States Patent
Liao et al.

(10) Patent No.: US 12,446,145 B2
(45) Date of Patent: Oct. 14, 2025

(54) CIRCUIT BOARD DEVICE AND ITS CIRCUIT MODULE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Huan-Yi Liao, Hsinchu (TW); Sheng-Fan Yang, Hsinchu (TW); Chi-Lou Yeh, Hsinchu (TW); Zhong-Yan You, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 182 days.

(21) Appl. No.: 18/542,773

(22) Filed: Dec. 18, 2023

(65) Prior Publication Data
US 2025/0113432 A1  Apr. 3, 2025

(30) Foreign Application Priority Data
Sep. 28, 2023  (TW) .................................. 112137362

(51) Int. Cl.
*H05K 1/02* (2006.01)
*H05K 1/11* (2006.01)

(52) U.S. Cl.
CPC ........... *H05K 1/0224* (2013.01); *H05K 1/115* (2013.01); *H05K 2201/09636* (2013.01)

(58) Field of Classification Search
CPC ................. H05K 1/0224; H05K 1/115; H05K 2201/09636
USPC .......................................................... 174/262
See application file for complete search history.

(56) References Cited

U.S. PATENT DOCUMENTS

| 2017/0094773 A1* | 3/2017 | Seo .................. H05K 1/115 |
| 2019/0254169 A1* | 8/2019 | Tay .................. H05K 1/186 |

FOREIGN PATENT DOCUMENTS

| CN | 111316434 A | 6/2020 |
| CN | 116782486 A | 9/2023 |

* cited by examiner

*Primary Examiner* — Andargie M Aychillhum
(74) *Attorney, Agent, or Firm* — CKC & Partners Co., LLC

(57) ABSTRACT

A circuit board device includes a multilayer board structure, a main ground and a circuit module. The main ground is configured in the multilayer board structure. The circuit module includes two differential-signal portions. These differential-signal portions are all located on one core layer of the multilayer board structure. Each of the differential-signal portions includes a differential through-hole pair and a plurality of ground through holes, and these ground through holes are arranged at intervals to surround the differential through-hole pair, and are electrically connected to the main ground. The patterns of the differential-signal portions are mirror symmetrical to each other based on an imaginary mirror line therebetween, and the minimum linear distances from the differential-signal portions to the imaginary mirror line are equal to each other.

16 Claims, 6 Drawing Sheets

CIRCUIT BOARD DEVICE AND ITS CIRCUIT MODULE

RELATED APPLICATIONS

This application claims priority to Taiwan Application Serial Number 112137362, filed on Sep. 28, 2023, which is herein incorporated by reference in its entirety.

BACKGROUND

Field of Disclosure

The present disclosure relates to a circuit board device. More particularly, the present disclosure relates to a circuit board device and a circuit module having a differential-signal circuit.

Description of Related Art

Generally, in the field of circuit board designs, as the integration level of circuit boards is improved, the configuration of components becomes closer.

However, because the gaps between the components on the circuit board are so closed, the transmission of high-density and high-speed signal arrays within the circuit board may seriously cause ball side crosstalk on the circuit board, thereby reducing the signal integrity within the circuit board.

Thus, the above-mentioned technology obviously still has inconveniences and defects, which are issues that the industry needs to solve urgently.

SUMMARY

One aspect of the present disclosure is to provide a circuit board device and its circuit module for solving the difficulties mentioned above in the prior art.

In one embodiment of the present disclosure, a circuit board device that is provided includes a multilayer board structure, a main ground and a circuit module. The multilayer board structure includes a plurality of sheet layers and a core layer sandwiched between the sheet layers. A thickness of the core layer is greater than a thickness of each of the sheet layers. The main ground is disposed in the multilayer board structure. The circuit module includes a first differential-signal portion and a second differential-signal portion. The first differential-signal portion is disposed on the core layer, and includes a first differential through-hole pair and a plurality of first ground through holes arranged at intervals to surround the first differential through-hole pair, and electrically connected to the main ground. The second differential-signal portion is disposed on the core layer, and includes a second differential through-hole pair and a plurality of second ground through holes arranged at intervals to surround the second differential through-hole pair, and electrically connected to the main ground. A pattern of the second differential-signal portion and a pattern of the first differential-signal portion are mirror symmetrical to each other based on an imaginary mirror line between the second differential-signal portion and the first differential-signal portion, and a minimum linear distance between the first differential-signal portion and the imaginary mirror line and a minimum linear distance between the second differential-signal portion and the imaginary mirror line are equal to each other.

In one embodiment of the present disclosure, a circuit module is provided and disposed on a core layer of a multilayer board structure. The circuit module includes a first differential-signal portion and a second differential-signal portion. The first differential-signal portion includes a first positive-signal channel, a first negative-signal channel and a plurality of first ground through holes. The first positive-signal channel and the first negative-signal channel are arranged sequentially in a first axis direction, and a first channel spacing is defined between the first positive-signal channel and the first negative-signal channel, and the first ground through holes are arranged at intervals to surround the first positive-signal channel and the first negative-signal channel. A first hole spacing is defined between the first positive-signal channel and one of the first ground through holes closer to the first positive-signal channel. The first positive-signal channel is not less than the first channel spacing, and is not greater than twice the first channel spacing, the first positive-signal channel and the aforementioned first ground through hole are arranged sequentially in a second axis direction that is intersected with the first axis direction and has a first included angle with the first axis direction. The second hole spacing that is equal to the first hole spacing is defined between the first negative-signal channel and one of the first ground through holes closer to the first negative-signal channel, and the first negative-signal channel and the aforementioned first ground through hole are arranged sequentially in a third axis direction that is intersected with the first axis direction and has a second included angle with the first axis direction, and the second included angle is equal to the first included angle. A pattern of the second differential-signal portion and a pattern of the first differential-signal portion are mirror symmetrical to each other based on an imaginary mirror line between the second differential-signal portion and the first differential-signal portion.

Thus, through the construction of the embodiments above, even if the components of the circuit board device in the disclosure are way too close with each other, the transmission of the high-density high-speed signal array in the circuit board device will not cause serious ball side crosstalk, thus improving the signal integrity in the circuit board device.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
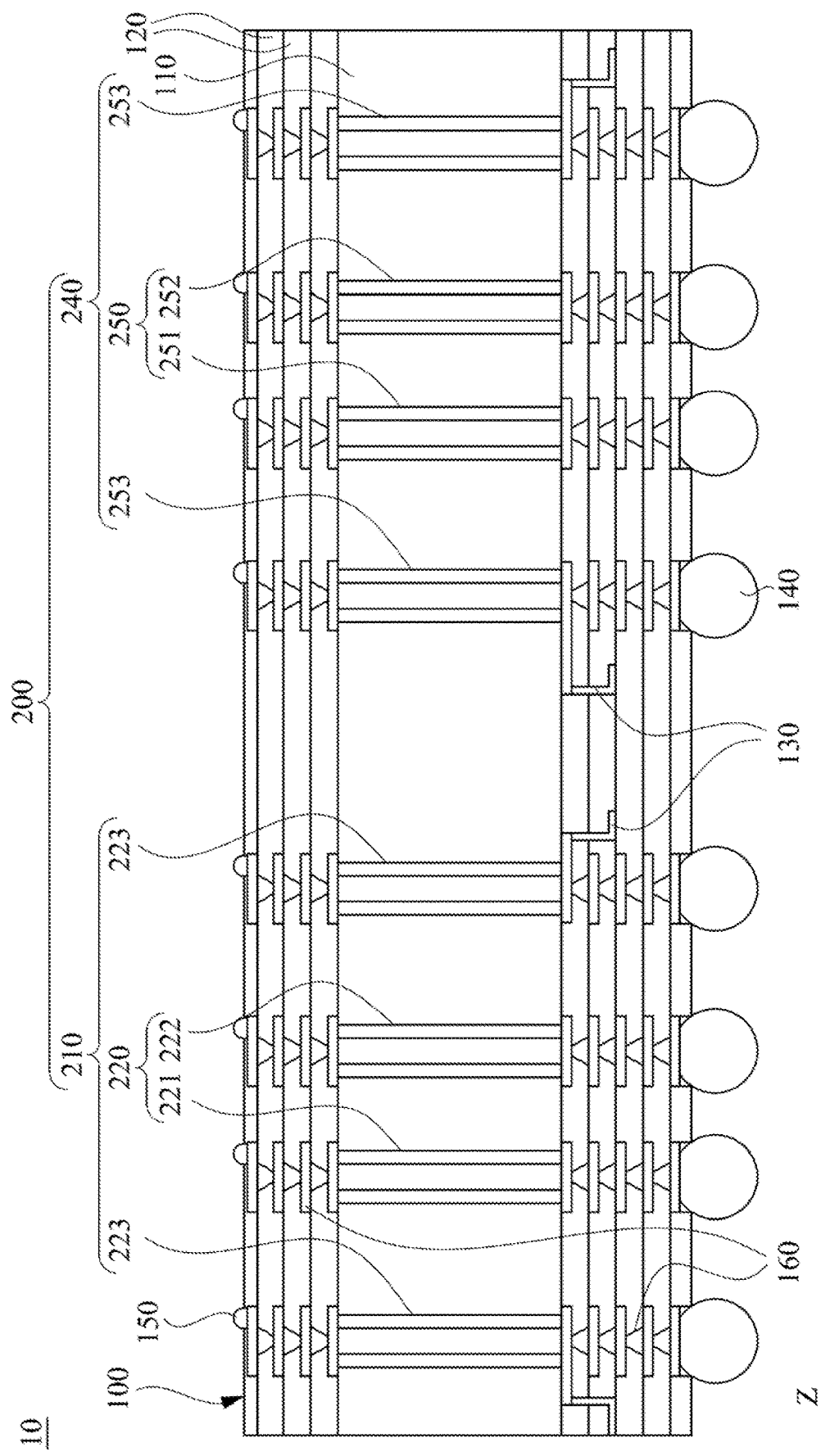
FIG. 1 is a side view of a circuit board device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
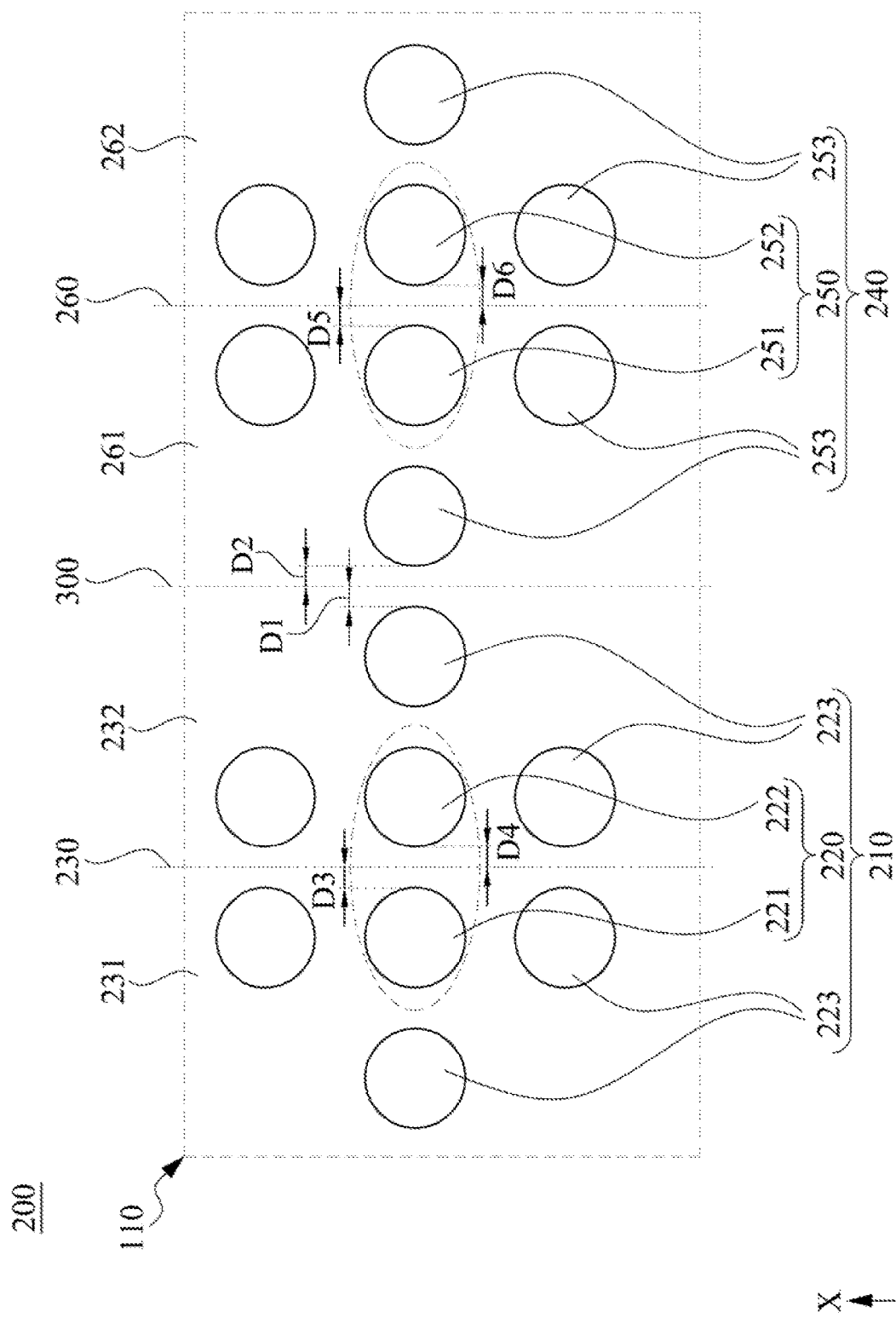
FIG. 2 is a top view of the circuit module of the circuit board device shown in FIG. 1.

Reference is now made to FIG. 1 and FIG. 2, in which FIG. 1 is a side view of a circuit board device 10 according to one embodiment of the present disclosure and FIG. 2 is a top view of the circuit module 200 of the circuit board device 10 shown in FIG. 1. As shown in FIG. 1 and FIG. 2, in this embodiment, the circuit board device 10 includes a multilayer board structure 100, a main ground 130 and a circuit module 200. The multilayer board structure 100 includes a core layer 110, a plurality of sheet layers (or insulating plate) 120, a solder ball layer 140 and a solder bump layer (e.g., C4 bump) 150. The sheet layers 120 are stacked one another along a longitudinal direction (e.g., Z axis). The core layer 110 is sandwiched between the sheet layers 120, and a thickness of the core layer 110 is greater than a thickness of each of the sheet layers 120. The solder ball layer 140 and the solder bump layer 150 are respectively exposed on two opposite outer sides of the sheet layers 120. The solder ball layer 140 includes a plurality of solder balls, and the solder bump layer 150 includes a plurality of solder bumps. The outer surfaces of the core layer 110 and the sheet layers 120 are made of insulating material, and printed circuits are distributed on the insulating material. The main ground 130 is configured in the multilayer board structure 100. For example, the main ground 130 is a copper foil ground, which is formed on one of the sheet layers 120 and extends along a transverse direction (e.g., X or Y axis). The circuit module 200 is located on the core layer 110, and the circuit module 200 is electrically connected to the solder ball layer 140 and the solder bump layer 150 which are located at opposite outer sides through via portions 160, respectively. The solder bump layer 150 is conducted to a chip set (not shown in figures) through a silicon interposer (not shown in figures) for receiving differential-signals from the chip set. Therefore, the solder bump layer 150 is called as a bump side of the multilayer board structure 100. The solder ball layer 140 is connected to a circuit load board (not shown in figures) for exchanging differential-signals with the circuit load board. Therefore, the solder ball layer 140 is called as a ball side of the multilayer board structure 100.

In one embodiment, the circuit board device 10 is a PCB substrate on a Chip-On-Wafer-On-Substrate (CoWoS) package. However, the present disclosure is not limited thereto.

More specifically, the circuit module 200 includes a plurality of differential-signal portions, and two of which are hereinafter referred to as a first differential-signal portion 210 and a second differential-signal portion 240. The first differential-signal portion 210 is disposed on the core layer 110, and the first differential-signal portion 210 includes a first differential through-hole pair (i.e., a pair of first differential through holes or two first differential through holes) 220 and a plurality of (e.g., 6) first ground through holes 223 arranged at intervals to surround the first differential through-hole pair 220, and electrically connected to the main ground 130. The surrounding pattern of the first ground through holes 223 to the first differential through-hole pair 220 plays a key shielding role for reducing the intensification of magnetic field coupling between differential-signals, thereby improving the impact to the multilayer board structure 100 due to ball side crosstalk. The second differential-signal portion 240 is disposed on the core layer 110, and the second differential-signal portion 240 includes a second differential through-hole pair (i.e., a pair of second differential through holes or two second differential through holes) 250 and a plurality of (e.g., 6) second ground through holes 253 arranged at intervals to surround the second differential through-hole pair 250, and electrically connected to the main ground 130. The surrounding pattern of the second ground through holes 253 to the second differential through-hole pair 250 plays a key shielding role for reducing the intensification of magnetic field coupling between differential-signals, thereby improving the impact to the multilayer board structure 100 due to ball side crosstalk.

A pattern (e.g., arrangement contour) of the second differential-signal portion 240 and a pattern (e.g., arrangement contour) of the first differential-signal portion 210 are mirror symmetrical to each other based on an imaginary mirror line 300 extending along the X-axis (for example) between the second differential-signal portion 240 and the first differential-signal portion 210, and a minimum linear distance D1 between the first differential-signal portion 210 and the imaginary mirror line 300 and a minimum linear distance D2 between the second differential-signal portion 240 and the imaginary mirror line 300 are equal to each other.

More specifically, the first differential-signal portion 210 includes a first positive-signal channel 221 and a first negative-signal channel 222 which are individually penetrated through the multilayer board structure 100 along the longitudinal direction (e.g., Z-axis), so as to be serve for first differential-signal transmission. The first positive-signal channel 221 and the first negative-signal channel 222 are sequentially arranged on the core layer 110 in a first arrangement direction (e.g., Y-axis), and the first positive-signal channel 221 and the first negative-signal channel 222 are arranged at intervals on the core layer 110, and the first arrangement direction (e.g., Y-axis) is orthogonal to the imaginary mirror line 300 (e.g., X-axis) and orthogonal to the longitudinal direction (e.g., Z-axis).

A first imaginary line 230, for example extending in X-axis is imaginarily shown between the first positive-signal channel 221 and the first negative-signal channel 222, and the first imaginary line 230 divides the pattern of the first differential-signal portion 210 into a first portion 231 and a second portion 232, and a pattern (e.g., arrangement contour) of the first portion 231 and a pattern (e.g., arrangement contour) of the second portion 232 are mirror symmetrical to each other based on the first imaginary line 230. A minimum linear distance D3 between the first positive-signal channel 221 and the first imaginary line 230 is equal to a minimum linear distance D4 between the first negative-signal channel 222 and the first imaginary line 230.

The second differential-signal portion 240 includes a second positive-signal channel 251 and a second negative-signal channel 252 which are individually penetrated through the multilayer board structure 100 along the longitudinal direction (e.g., Z-axis), so as to be serve for second differential-signal transmission. The second positive-signal channel 251 and the second negative-signal channel 252 are sequentially arranged on the core layer 110 in the first arrangement direction (e.g., Y-axis), and the second positive-signal channel 251 and the second negative-signal channel 252 are arranged at intervals on the core layer 110, and the first arrangement direction (e.g., Y-axis) is orthogonal to the imaginary mirror line 300 (e.g., X-axis) and orthogonal to the longitudinal direction (e.g., Z-axis).

A second imaginary line 260 is imaginarily shown between the second positive-signal channel 251 and the second negative-signal channel 252, and the second imaginary line 260 divides the pattern of the second differential-signal portion 240 into a third portion 261 and a fourth portion 262, and a pattern (e.g., arrangement contour) of the third portion 261 and a pattern (e.g., arrangement contour) of the fourth portion 262 are mirror symmetrical to each other based on the second imaginary line 260. A minimum linear distance D5 between the second positive-signal channel 251 and the second imaginary line 260 is equal to a minimum linear distance D6 between the second negative-signal channel 252 and the second imaginary line 260.

Therefore, since the imaginary mirror line 300 is between the first imaginary line 230 and the second imaginary line 260, and parallel to the first imaginary line 230 and the second imaginary line 260, in this embodiment, as shown in FIG. 2, the first portion 231, the second portion 232, the third portion 261 and the fourth portion 262 are linearly arranged in sequence along the first arrangement direction (e.g., Y-axis).

In this embodiment, the arrangement order of the first positive-signal channel 221 and the first negative-signal channel 222 of the first differential through-hole pair 220 which are arranged from left to right is the same as the arrangement order of the second positive-signal channel 251 and the second negative-signal channel 252 of the second differential through-hole pair 250 which are arranged from left to right. That is, the first negative-signal channel 222 and the second positive-signal channel 251 are located between the first positive-signal channel 221 and the second negative-signal channel 252. However, the disclosure is not limited thereto. In other embodiments, it is possible to modify the arrangement order of the first positive-signal channel 221 and the first negative-signal channel 222 which are arranged from left to right is opposite to the arrangement order of the second positive-signal channel 251 and the second negative-signal channel 252 of the second differential through-hole pair 250 which are arranged from left to right. That is, the first negative-signal channel 222 and the second negative-signal channel 252 are located between the first positive-signal channel 221 and the second positive-signal channel 251.

In this way, since the second differential-signal portion 240 and the first differential-signal portion 210 are mirror symmetric patterns with each other according to the imaginary mirror line 300, this embodiment is able to reduce the transmission of high-density and high-speed signal arrays on the circuit board. Thereby reducing the signal integrity within the circuit board.

Figure 3:
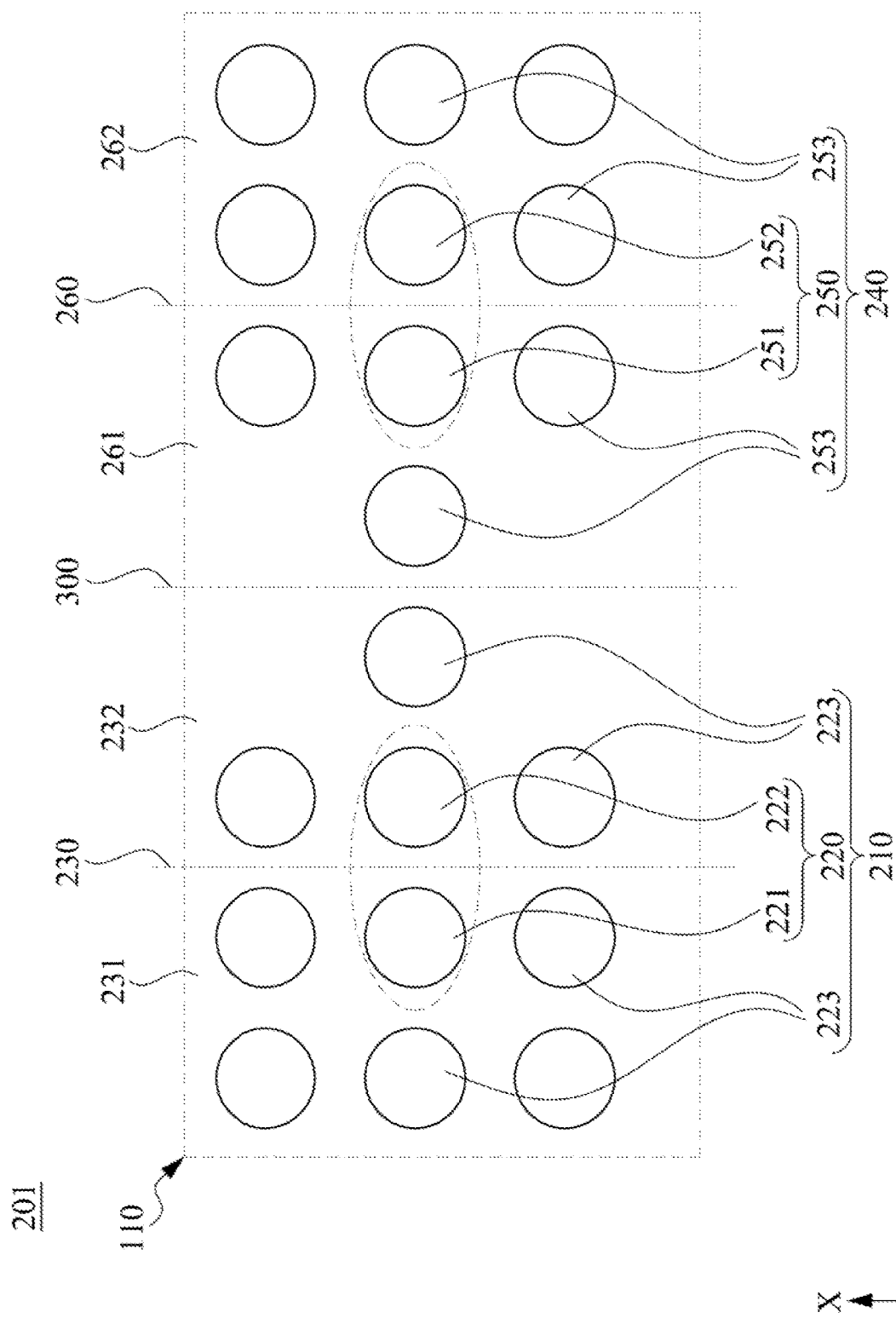
FIG. 3 is a top view of a circuit module according to one embodiment of the present disclosure.

FIG. 3 is a top view of a circuit module 201 according to one embodiment of the present disclosure. As shown in FIG. 3, the circuit module 201 of the present embodiment is substantially the same to the circuit module 200 in FIG. 2, and the difference therebetween is that, the pattern (e.g., arrangement contour) of the first portion 231 and the pattern (e.g., arrangement contour) of the second portion 232 are not mirror symmetrical to each other, or called non-mirror symmetrical patterns. The pattern (e.g., arrangement contour) of the third portion 261 and the pattern (e.g., arrangement contour) of the fourth portion 262 are not mirror symmetrical to each other, or called non-mirror symmetrical patterns.

More specifically, some of the first ground through holes 223 in the first portion 231 are five in number and arranged in a U shape, and the other of the first ground through holes 223 in the second portion 232 are three in number and arranged in a V shape. All of the first ground through holes 223 of the first differential-signal portion 210 surround the first differential through-hole pair 220. Some of the second ground through holes 253 in the third portion 261 are three in number and arranged in a V shape, and the other of the second ground through holes 253 in the fourth portion 262 are five in number and arranged in a U shape. All of the second ground through holes 253 of the second differential-signal portion 240 surround the second differential through-hole pair 220.

Therefore, since the imaginary mirror line 300 is parallel to the first imaginary line 230 and the second imaginary line 260, and the second differential-signal portion 240 and the first differential-signal portion 210 are mirror symmetry patterns based on the imaginary mirror line 300, the embodiment is able to further reduce the transmission of high-density and high-speed signal arrays on the circuit board, thereby reducing the signal integrity within the circuit board.

Figure 4:
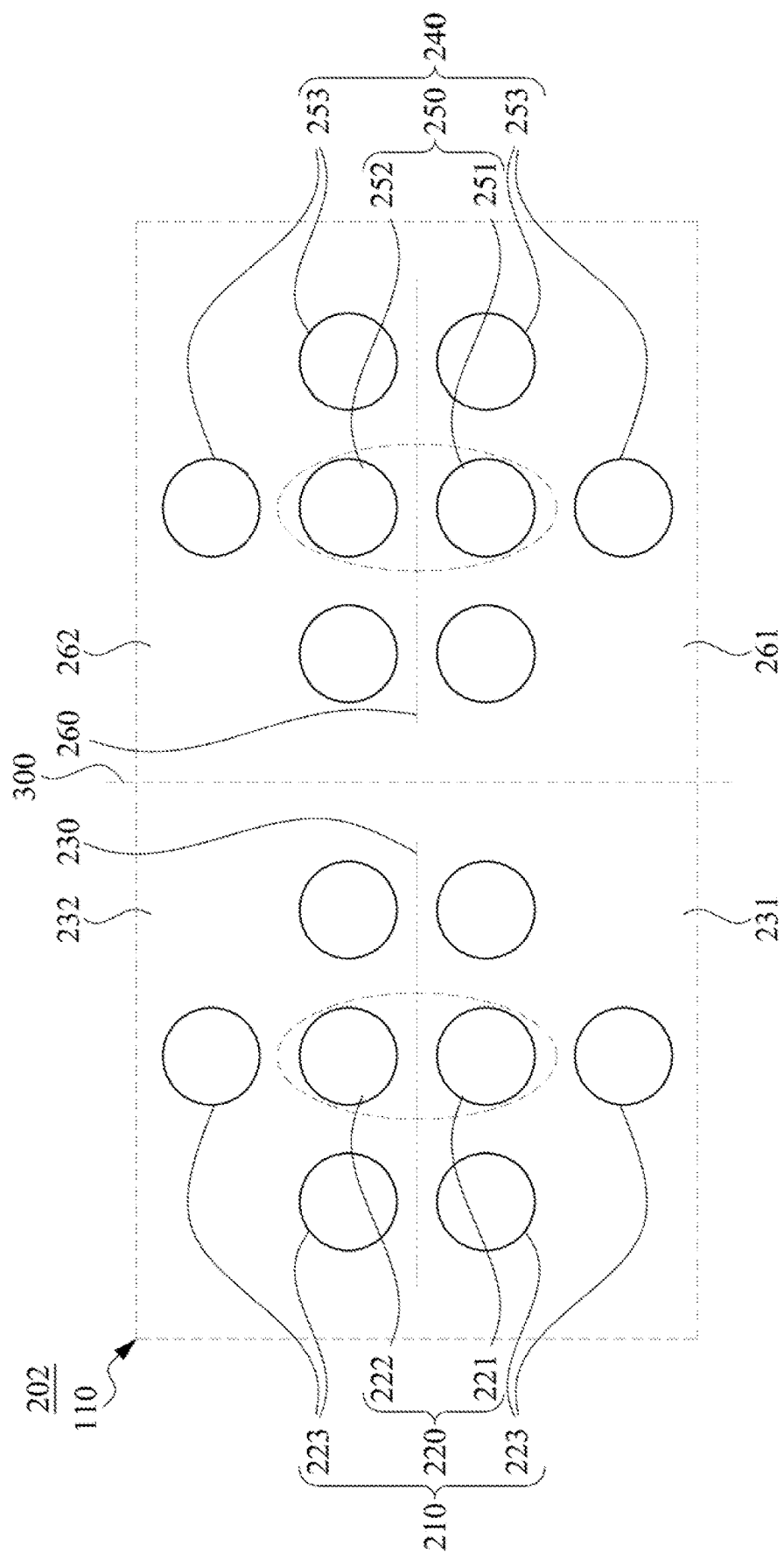
FIG. 4 is a top view of a circuit module according to one embodiment of the present disclosure.

FIG. 4 is a top view of a circuit module according to one embodiment of the present disclosure. As shown in FIG. 4, the circuit module 202 of the present embodiment is substantially the same to the circuit module 200 in FIG. 2, and the difference therebetween is that, the first positive-signal channel 221 and the first negative-signal channel 222 are sequentially arranged on the core layer 110 in a second arrangement direction (e.g., X-axis), and the second arrangement direction is parallel to the imaginary mirror line 300 (e.g., X-axis), and is orthogonal to the longitudinal direction (e.g., Z-axis). The second positive-signal channel 251 and the second negative-signal channel 252 are sequentially arranged on the core layer 110 in the second arrangement direction (e.g., X-axis). Furthermore, the first portion 231 and the third portion 261 are linearly arranged in sequence along the first arrangement direction (e.g., Y-axis). The second portion 232 and the fourth portion 262 are arranged in sequence along the first arrangement direction (e.g., Y-axis).

Therefore, since the imaginary mirror line 300 is orthogonal to the first imaginary line 230 and the second imaginary line 260, and the second differential-signal portion 240 and the first differential-signal portion 210 are mirror symmetry patterns based on the imaginary mirror line 300, the embodiment is able to further reduce the transmission of high-density and high-speed signal arrays on the circuit board, thereby reducing the signal integrity within the circuit board.

Figure 5:
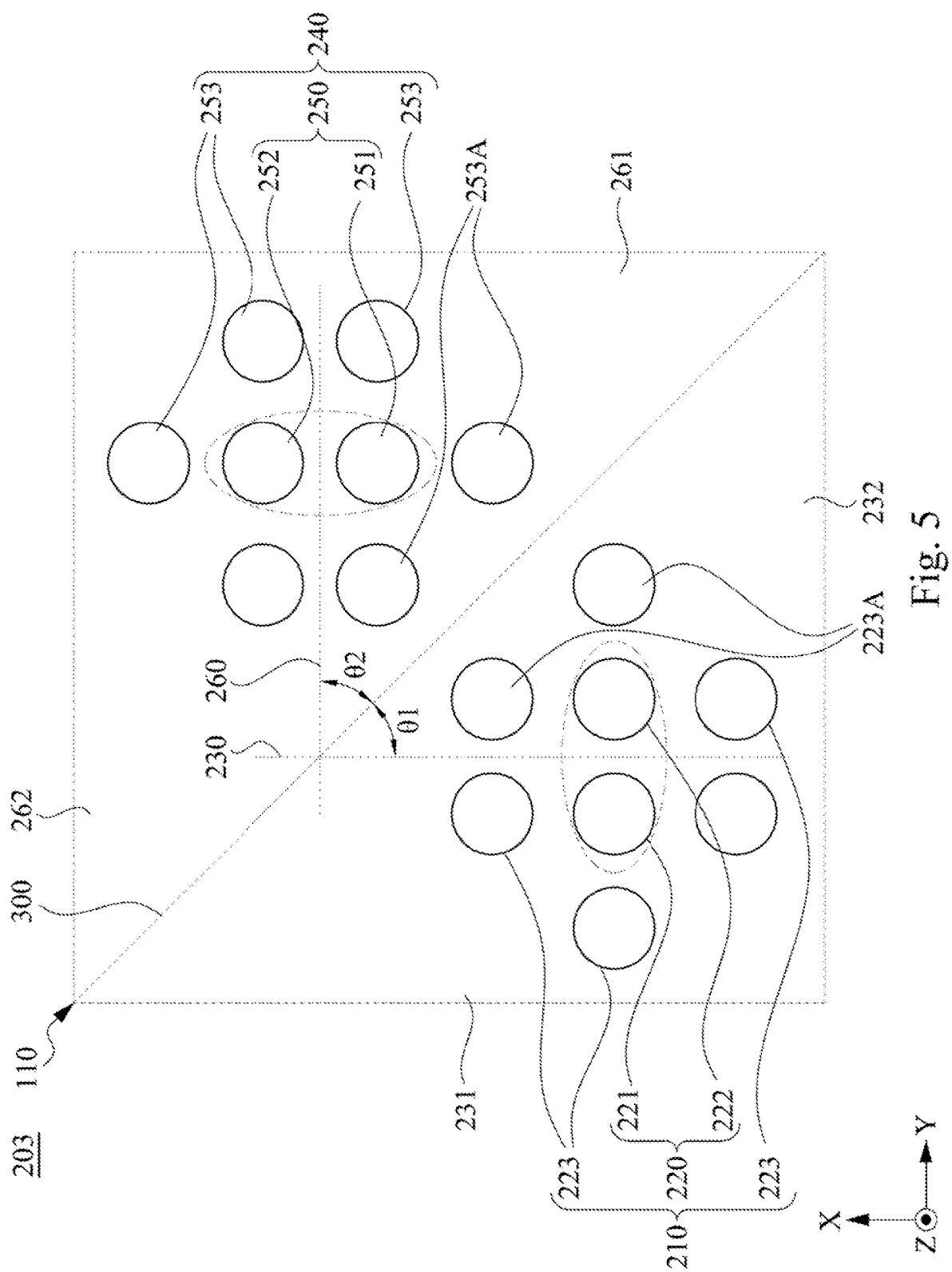
FIG. 5 is a top view of a circuit module according to one embodiment of the present disclosure.

FIG. 5 is a top view of a circuit module 203 according to one embodiment of the present disclosure. As shown in FIG. 5, the circuit module 203 of the present embodiment is substantially the same to the circuit module 200 in FIG. 2, and the difference therebetween is that, the first imaginary line 230 (e.g., extending in X-axis) is defined between the first positive-signal channel 221 and the first negative-signal channel 222, and an included angle θ1 of 45° is formed by the first imaginary line 230 and the imaginary mirror line 300. The second imaginary line 260 (e.g., extending in Y-axis) is defined between the second positive-signal channel 251 and the second negative-signal channel 252, and an included angle θ2 of 45° is formed by the second imaginary line 260 and the imaginary mirror line 300. Thus, the first imaginary line 230 and the second imaginary line 260 are orthogonal to each other. The sequential arrangement direction of two first ground through holes 223A of the second portion 232 and the sequential arrangement direction of two second ground through holes 253A of the third portion 261 are parallel to each other, and are parallel to the imaginary mirror line 300.

Therefore, since the imaginary mirror line 300 intersects the first imaginary line 230 and the second imaginary line 260, and the second differential-signal portion 240 and the first differential-signal portion 210 are mirror symmetry patterns with each other according to the imaginary mirror line 300, the embodiment is able to further reduce the transmission of high-density and high-speed signal arrays on the circuit board, thereby reducing the signal integrity within the circuit board.

Figure 6:
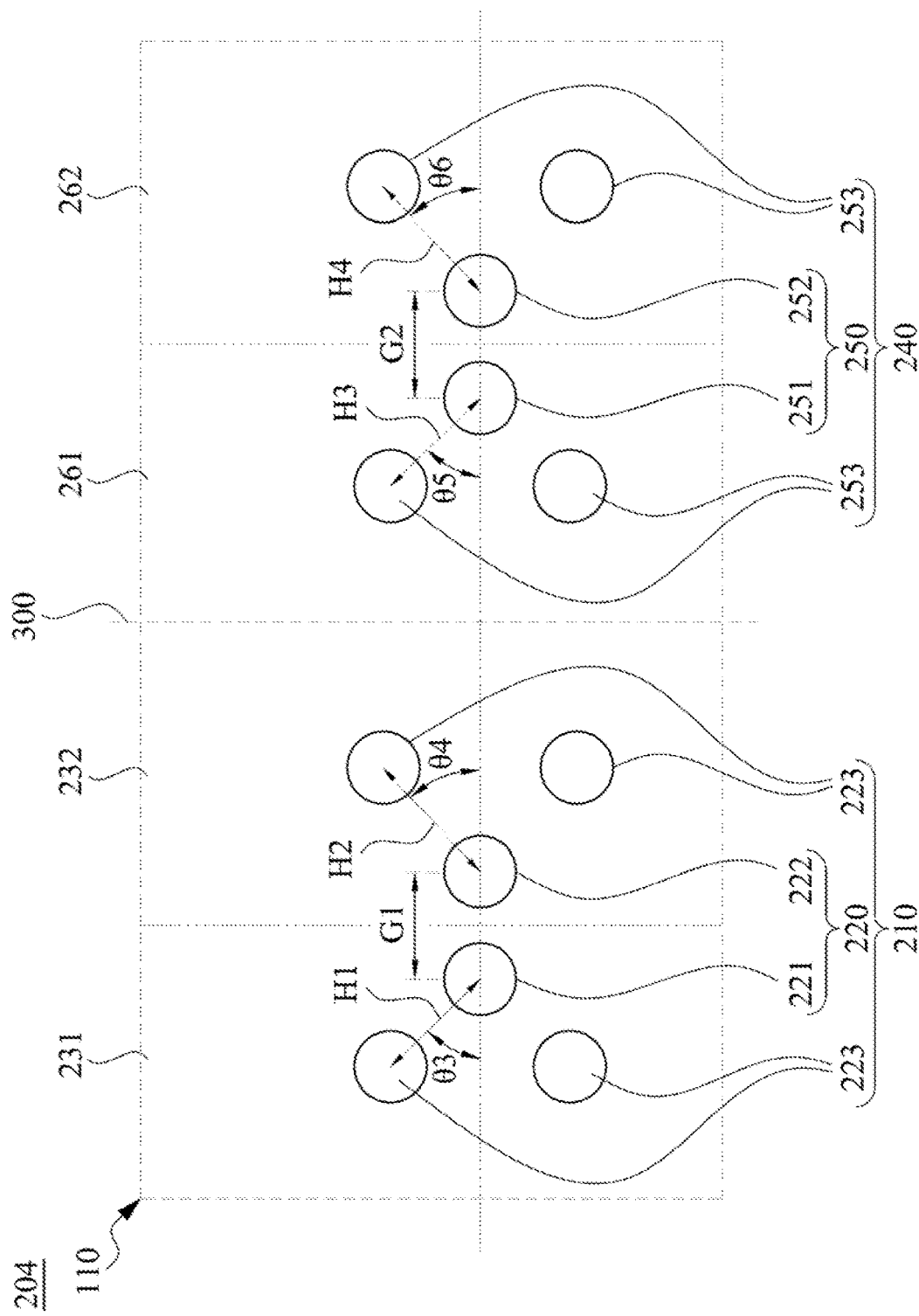
FIG. 6 is a top view of a circuit module according to one embodiment of the present disclosure.

FIG. 6 is a top view of a circuit module 204 according to one embodiment of the present disclosure. As shown in FIG. 5, the circuit module 204 of this embodiment can be implemented to the circuit modules 200 to 203 of the aforementioned embodiments. The first ground through holes 223 of the circuit module 204 in the embodiment are four in number, and a first channel spacing G1 is defined between the first positive-signal channel 221 and the first negative-signal channel 222. A first hole spacing H1 is defined between the first positive-signal channel 221 and each of the first ground through holes 223 in the first portion 231. A second hole spacing H2 is defined between the first negative-signal channel 222 and each of the first ground through holes 223 in the second portion 232. The first hole spacing H1 is greater than or equal to (i.e., not less) than the first channel spacing G1, and is less than or equal to (i.e., not greater) than twice the first channel spacing G1, and the second hole spacing H2 is equal to the first hole spacing H1.

It is noted, the first positive-signal channel 221, the first negative-signal channel 222 and the first ground through holes 223 are respectively circular, and the first channel spacing G1 is a minimum linear length between a center of the circle of the first positive-signal channel 221 and a center of the circle of the first negative-signal channel 222. The first hole spacing H1 is a minimum linear length between a center of the circle of the first positive-signal channel 221 and a center of the circle of one of the first ground through holes 223. The second hole spacing H2 is a minimum linear length between a center of the circle of the first negative-signal channel 222 and a center of the circle of one of the first ground through holes 223.

In addition, a third included angle θ3 is formed by the first arrangement direction (e.g., Y-axis) and an imaginary connection line between the first positive-signal channel 221 and one of the first ground through holes 223. A fourth included angle θ4 is formed by the first arrangement direction (e.g., Y-axis) and an imaginary connection line between the first negative-signal channel 222 and one of the first ground through holes 223, and the fourth included angle θ4 is equal to the third included angle θ3.

Similarly, as shown in FIG. 6, the second ground through holes 253 in the embodiment are four in number, a second channel spacing G2 is defined between the second positive-signal channel 251 and the second negative-signal channel 252. A third hole spacing H3 is defined between the second positive-signal channel 251 and each of the second ground through holes 253 in the third portion 261. A fourth hole spacing H4 is defined between the second negative-signal channel 252 and each of the second ground through holes 253 in the fourth portion 262. The third hole spacing H3 is greater than or equal to (i.e., not less than) the second channel spacing G2, and less than or equal to (i.e., not greater than) twice the second channel spacing G2, and the fourth hole spacing H4 is equal to the third hole spacing H3.

It is noted, the second positive-signal channel 251, the second negative-signal channel 252 and the second ground through holes 253 are respectively circular, and the second channel spacing G2 is a minimum linear length between a center of the circle of the second positive-signal channel 251 and a center of the circle of the second negative-signal channel 252. The third hole spacing H3 is a minimum linear length between a center of the circle of the second positive-signal channel 251 and a center of the circle of one of the second ground through holes 253 in the third portion 261. The fourth hole spacing H4 is a minimum linear length between a center of the circle of the second negative-signal channel 252 and a center of the circle of one of the second ground through holes 253 in the fourth portion 262.

Furthermore, a fifth included angle θ5 is formed by the first arrangement direction (e.g., Y-axis) and an imaginary connection line between the second positive-signal channel 251 and one of the second ground through holes 253. A sixth included angle θ6 is formed by the first arrangement direction (e.g., Y-axis) and an imaginary connection line between the second negative-signal channel 252 and one of the second ground through holes 253, and the sixth included angle θ6 is equal to the fifth included angle θ5.

Therefore, because of the configuration variation of the first ground through holes 223, the first positive-signal channel 221, the first negative-signal channel 222, the second positive-signal channel 251, the second negative-signal channel 252 and the second ground through holes 253, and the second differential-signal portion 240 and the first differential-signal portion 210 being mirror symmetry patterns based on the imaginary mirror line 300, this embodiment is able to reduce the transmission of high-density and high-speed signal arrays on the circuit board, thereby reducing the signal integrity within the circuit board.

Thus, through the construction of the embodiments above, even if the components of the circuit board device in the disclosure are way too close with each other, the transmission of the high-density high-speed signal array in the circuit board device will not cause serious ball side crosstalk, thus improving the signal integrity in the circuit board device.

Although the present disclosure has been described in considerable detail with reference to certain embodiments thereof, other embodiments are possible.

Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure covers modifications and variations of this disclosure provided they fall within the scope of the following claims and their equivalents.

What is claimed is:

1. A circuit board device, comprising:
 a multilayer board structure comprising a plurality of sheet layers and a core layer sandwiched between the sheet layers, wherein a thickness of the core layer is greater than a thickness of each of the sheet layers;
 a main ground disposed in the multilayer board structure; and
 a circuit module comprising:
  a first differential-signal portion disposed on the core layer, and comprising a first differential through-hole pair and a plurality of first ground through holes arranged at intervals to surround the first differential through-hole pair, and electrically connected to the main ground; and a second differential-signal portion disposed on the core layer, and comprising a second differential through-hole pair and a plurality of second ground through holes arranged at intervals to surround the second differential through-hole pair, and electrically connected to the main ground, wherein a pattern of the second differential-signal portion and a pattern of the first differential-signal portion are mirror symmetrical to each other based on an imaginary mirror line between the second differential-signal portion and the first differential-signal portion, and a minimum linear distance between the first differential-signal portion and the imaginary mirror line and a minimum linear distance between the second differential-signal portion and the imaginary mirror line are equal to each other.

2. The circuit board device of claim 1, wherein the first differential-signal portion comprises a first positive-signal channel and a first negative-signal channel which are arranged sequentially in a first linear direction, and the first linear direction is parallel to, or intersects the imaginary mirror line.

3. The circuit board device of claim 2, wherein a first imaginary line is located between the first positive-signal channel and the first negative-signal channel, and the first imaginary line divides the pattern of the first differential-signal portion into a first portion and a second portion, and a pattern of the first portion and a pattern of the second portion are mirror symmetrical to each other based on the first imaginary line, wherein a minimum linear distance between the first positive-signal channel and the first imaginary line and a minimum linear distance between the first negative-signal channel and the first imaginary line are equal to each other.

4. The circuit board device of claim 3, wherein the second differential-signal portion comprises a second positive-signal channel and a second negative-signal channel which are arranged sequentially in a second linear direction, and the second linear direction is parallel to, or intersects the first linear direction.

5. The circuit board device of claim 4, wherein a second imaginary line is located between the second positive-signal channel and the second negative-signal channel, and the second imaginary line divides the pattern of the second differential-signal portion into a third portion and a fourth portion, and a pattern of the third portion and a pattern of the fourth portion are mirror symmetrical to each other based on the second imaginary line, wherein a minimum linear distance between the second positive-signal channel and the second imaginary line and a minimum linear distance between the second negative-signal channel and the second imaginary line are equal to each other.

6. The circuit board device of claim 4, wherein a pattern shown collectively by the first positive-signal channel and the first negative-signal channel of the first differential through-hole pair is equal to a pattern shown collectively by the second positive-signal channel and the second negative-signal channel of the second differential through-hole pair; or a pattern shown collectively by the first positive-signal channel and the first negative-signal channel of the first differential through-hole pair is mirror symmetrical to a pattern shown collectively by the second positive-signal channel and the second negative-signal channel of the second differential through-hole pair based on the imaginary mirror line.

7. The circuit board device of claim 3, wherein a first channel spacing is defined between the first positive-signal channel and the first negative-signal channel, and a first hole spacing is defined between one of the first ground through holes in the first portion and the first positive-signal channel, wherein the first hole spacing is not less than the first channel spacing, and is not greater than twice the first channel spacing.

8. The circuit board device of claim 7, wherein a second hole spacing is defined between one of the first ground through holes in the second portion and the first negative-signal channel, and the second hole spacing is equal to the first hole spacing.

9. The circuit board device of claim 5, wherein a second channel spacing is defined between the second positive-signal channel and the second negative-signal channel, and a third hole spacing is defined between one of the second ground through holes in the third portion and the second positive-signal channel, wherein the third hole spacing is not less than the second channel spacing, and is not greater than twice the second channel spacing.

10. The circuit board device of claim 9, wherein a fourth hole spacing is defined between one of the second ground through holes in the fourth portion and the second negative-signal channel, and the fourth hole spacing is equal to the third hole spacing.

11. A circuit module disposed on a core layer of a multilayer board structure, comprising:

a first differential-signal portion comprising a first positive-signal channel, a first negative-signal channel and a plurality of first ground through holes, the first positive-signal channel and the first negative-signal channel which are arranged sequentially in a first axis direction, and a first channel spacing that is defined between the first positive-signal channel and the first negative-signal channel, and the first ground through holes are arranged at intervals to surround the first positive-signal channel and the first negative-signal channel, wherein a first hole spacing is defined between the first positive-signal channel and one of the first ground through holes closer to the first positive-signal channel, and the first positive-signal channel is not less than the first channel spacing, and is not greater than twice the first channel spacing, the first positive-signal channel and the one of the first ground through holes are arranged sequentially in a second axis direction that is intersected with the first axis direction and has a first included angle with the first axis direction, a second hole spacing being equal to the first hole spacing is defined between the first negative-signal channel and one of the first ground through holes closer to the first negative-signal channel, and the first negative-signal channel and the one of the first ground through holes are arranged sequentially in a third axis direction that is intersected with the first axis direction and has a second included angle with the first axis direction, and the second included angle is equal to the first included angle; and a second differential-signal portion, wherein a pattern of the second differential-signal portion and a pattern of the first differential-signal portion are mirror symmetrical to each other based on an imaginary mirror line between the second differential-signal portion and the first differential-signal portion.

12. The circuit module of claim 11, wherein the second differential-signal portion comprises a second positive-signal channel, a second negative-signal channel and a plurality of second ground through holes, the second positive-signal channel and the second negative-signal channel are arranged sequentially in a fourth axis direction, and a second channel spacing is defined between the second positive-signal channel and the second negative-signal channel, and the second ground through holes are arranged at intervals to surround the second positive-signal channel and the second negative-signal channel, wherein a third hole spacing is defined between the second positive-signal channel and one of the second ground through holes closer to the second positive-signal channel, and the third hole spacing is not less than the second channel spacing, and is not greater than twice the second channel spacing, the second positive-signal channel and the one of the second ground through holes are arranged sequentially in a fifth axis direction that is intersected with the fourth axis direction and has a third included angle with the fourth axis direction, a fourth hole spacing being equal to the third hole spacing is defined between the second negative-signal channel and one of the second ground through holes closer to the second negative-signal channel, and the second negative-signal channel and the one of the second ground through holes are arranged sequentially in a sixth axis direction that is intersected with the fourth axis direction and has a fourth included angle with the fourth axis direction, and the fourth included angle is equal to the third included angle.

13. The circuit module of claim 12, wherein the first axis direction is parallel to, or intersects with the imaginary mirror line, and the fourth axis direction is parallel to, or intersects with the first axis direction.

14. The circuit module of claim 11, wherein a first imaginary line is located between the first positive-signal channel and the first negative-signal channel, and the first imaginary line divides the pattern of the first differential-signal portion into a first portion and a second portion, and a pattern of the first portion and a pattern of the second portion are mirror symmetrical to each other based on the first imaginary line, wherein a minimum linear distance between the first positive-signal channel and the first imaginary line and a minimum linear distance between the first negative-signal channel and the first imaginary line are equal to each other.

15. The circuit module of claim 13, wherein a second imaginary line is located between the second positive-signal channel and the second negative-signal channel, and the second imaginary line divides the pattern of the second differential-signal portion into a third portion and a fourth portion, and a pattern of the third portion and a pattern of the fourth portion are mirror symmetrical to each other based on the second imaginary line, wherein a minimum linear distance between the second positive-signal channel and the second imaginary line and a minimum linear distance between the second negative-signal channel and the second imaginary line are equal to each other.

16. The circuit module of claim 12, wherein a pattern shown collectively by the first positive-signal channel and the first negative-signal channel is equal to a pattern shown collectively by the second positive-signal channel and the second negative-signal channel; or a pattern shown collectively by the first positive-signal channel and the first negative-signal channel is mirror symmetrical to a pattern shown collectively by the second positive-signal channel and the second negative-signal channel based on the imaginary mirror line.

* * * * *